United States Patent
Nomiyama (10) Patent No.: US 7,983,056 B2
(45) Date of Patent: Jul. 19, 2011

(54) SEMICONDUCTOR DEVICE

(75) Inventor: Takahiro Nomiyama, Nagano (JP)

(73) Assignees: Fuji Electric Systems Co., Ltd., Tokyo (JP); LG Electronics Inc., Seoul (KR)

( * ) Notice: Subject to any disclaimer, the term of this patent is extended or adjusted under 35 U.S.C. 154(b) by 1265 days.

(21) Appl. No.: 11/471,730

(22) Filed: Jun. 21, 2006

(65) Prior Publication Data

US 2007/0029985 A1   Feb. 8, 2007

(30) Foreign Application Priority Data

Jun. 24, 2005   (JP) ................................. 2005-185687

(51) Int. Cl.
*H05K 1/11* (2006.01)

(52) U.S. Cl. ........ 361/803; 361/799; 257/686; 257/691; 345/59; 345/87; 345/100; 345/211; 349/56; 349/150

(58) Field of Classification Search .................. 361/803, 361/681, 686, 799; 257/686, 691; 345/59, 345/87, 100, 211; 349/56, 150

See application file for complete search history.

(56) References Cited

U.S. PATENT DOCUMENTS

| | | | |
|---|---|---|---|
| 4,885,628 A | 12/1989 | Nagai et al. | |
| 5,307,464 A * | 4/1994 | Akao et al. | 715/810 |
| 6,236,393 B1 * | 5/2001 | Ogawa et al. | 345/211 |
| 6,297,842 B1 | 10/2001 | Koizumi et al. | |
| 6,329,969 B1 * | 12/2001 | Yano | 345/87 |
| 6,697,041 B1 * | 2/2004 | Tamai et al. | 345/100 |
| 6,853,430 B2 * | 2/2005 | Murahashi et al. | 349/150 |
| 7,023,410 B2 * | 4/2006 | Lee et al. | 345/87 |
| 2003/0038771 A1 | 2/2003 | Sunohara | |
| 2003/0103018 A1 * | 6/2003 | Yokota et al. | 345/59 |
| 2003/0209740 A1 * | 11/2003 | Miyamoto et al. | 257/286 |
| 2004/0027508 A1 * | 2/2004 | Akiyama et al. | 349/56 |
| 2004/0178977 A1 * | 9/2004 | Nakayoshi et al. | 345/87 |
| 2004/0211982 A1 | 10/2004 | Li et al. | |
| 2004/0251535 A1 * | 12/2004 | Nagata et al. | 257/691 |

FOREIGN PATENT DOCUMENTS

| | | |
|---|---|---|
| EP | 0 307 231 A2 | 3/1989 |
| JP | 61-051866 A | 3/1986 |
| JP | 6-69940 U | 9/1994 |
| JP | 2004-311536 A | 11/2004 |
| JP | 2005-107239 A | 4/2005 |

OTHER PUBLICATIONS

Yoshinobu Shigeta, "*Integrated Circuits for Color Plasma Display Panel Drivers*", Fuji Electric Journal, vol. 69, No. 8, 1996, p. 426-429.

Gen Tada, "*PDP Address Driver IC Technology*", Fuji Electric Journal, vol. 76, No. 3, 2003, p. 172-174.

Nomiyama et al., "New 256-ch PDP Address Driver IC with Reducing Switching Noise", IDW/AD, pp. 453-456.

* cited by examiner

*Primary Examiner* — Xiaoliang Chen (74) *Attorney, Agent, or Firm* — Rabin & Berdo, P.C.

(57) ABSTRACT

In a semiconductor device provided with terminals for external connection, input terminals, power supply terminals and ground terminals are disposed close together on part of one edge portion of two opposing edge portions. Output terminals are disposed in the vicinity of both ends of the one edge portion and on another edge portion of the two edge portions. A ground wiring is routed from the other edge portion and connected to the ground terminals. In so doing, elemental devices connected to the input terminals are disposed close together, whereby needless gaps do not arise between the elemental devices. A ground potential is also supplied by the ground wiring.

12 Claims, 9 Drawing Sheets

SEMICONDUCTOR DEVICE

BACKGROUND OF THE INVENTION

1. Field of the Invention

The invention relates to a semiconductor device disposed with terminals for external connection.

2. Description of the Related Art

Liquid crystal displays (LCD) and plasma display panels (PDP), whose screen size is easy to enlarge, are currently gaining attention over displays using Braun tubes.

In these plasma display panels, high-voltage circuits and logic circuits that control the high-voltage circuits are disposed at output terminals of a PDP address driver integrated circuit (IC) inside a PDP module. Amplifier circuits are also disposed at input terminals of the PDP address driver IC. The addresses of the pixels of the plasma display are designated as a result of these circuits operating.

In order to reduce the manufacturing cost of the PDP module, the number of output terminals of a single PDP address driver IC is increasing and the number of parts inside the PDP module is being reduced. Specifically, the number of output terminals is being increased from 96 to 192 or 256. Further, in order to reduce the manufacturing cost of the PDP module, the PDP address driver IC is increasingly being mounted with respect to a tape carrier package (TCP) rather than a chip on flexible film (COF).

Figure 7:
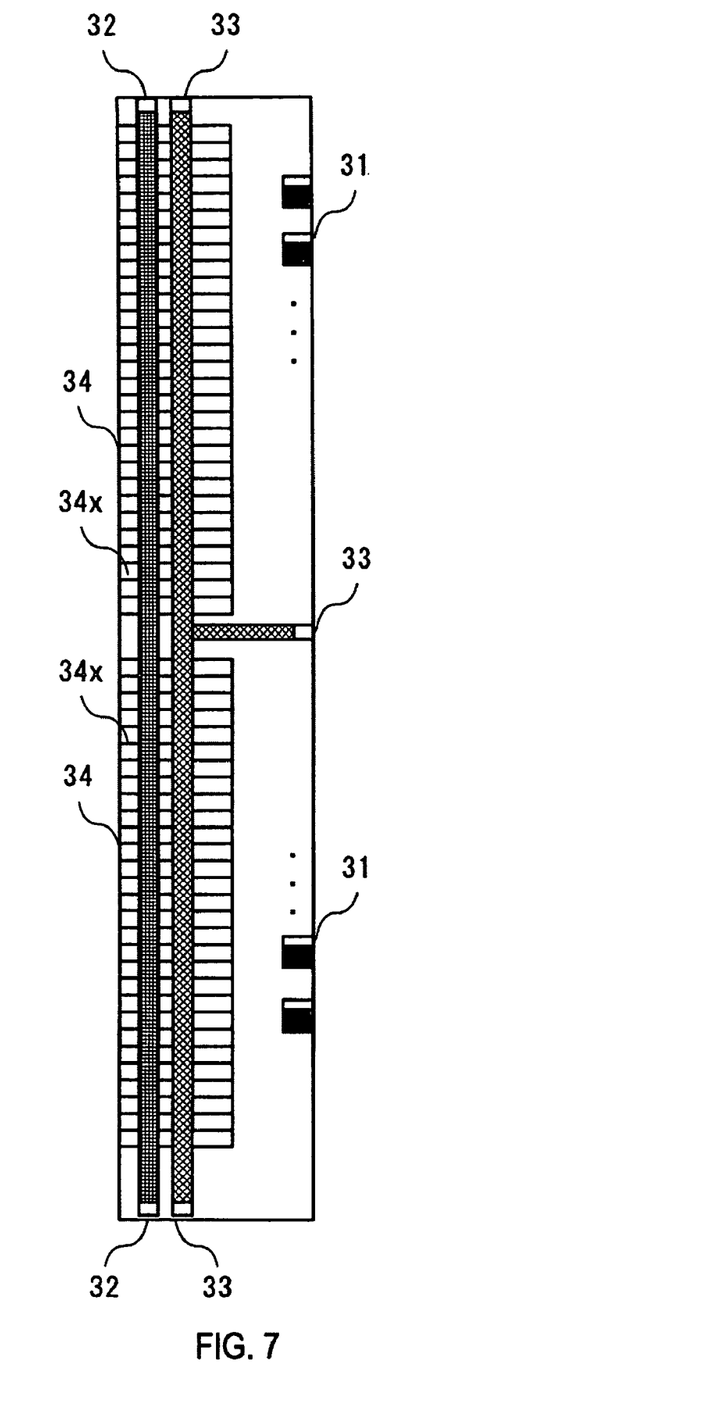
FIG. 7 is a diagram showing a one-row type of PDP address driver IC.

A technology has been proposed where the input terminals are arranged in one row on one edge portion of the PDP address driver IC, and where the output terminals are arranged in another row on the other edge portion of the PDP address driver IC (abbreviated below as "the one-row type"). FIG. 7 is a diagram showing a one-row type of PDP address driver IC.

In the one-row type, all of the input terminals 31 are disposed in one row on one edge portion, and all of the output portions 34 are disposed in another row on the other edge portion. Also, in the one-row type, a power supply potential is supplied from two power supply terminals 32 at both ends of a power supply wiring, and a ground potential is supplied from three ground terminals 33 at both ends and in the vicinity of the center of a ground wiring.

In the one-row type, when the PDP address driver IC is to be mounted with respect to a TCP, the terminals of the TCP are disposed in a direction parallel to the longitudinal direction of the PDP address driver IC. Thus, the length in the winding direction of the TCP becomes shorter and the manufacturing cost of the PDP module is reduced. Moreover, in the one-row type, even when the number of output terminals of the PDP address driver IC is increased and the routing of the wiring connecting elemental devices to elemental devices is lengthened, it is more difficult for the wiring resistance of the ground wiring to increase because the three ground terminals 33 are disposed with respect to the ground wiring. Thus, as it is harder for the wiring resistance to rise, it is harder for the ground potential to rise, and it is therefore more difficult for the PDP address driver IC to malfunction.

Figure 8:
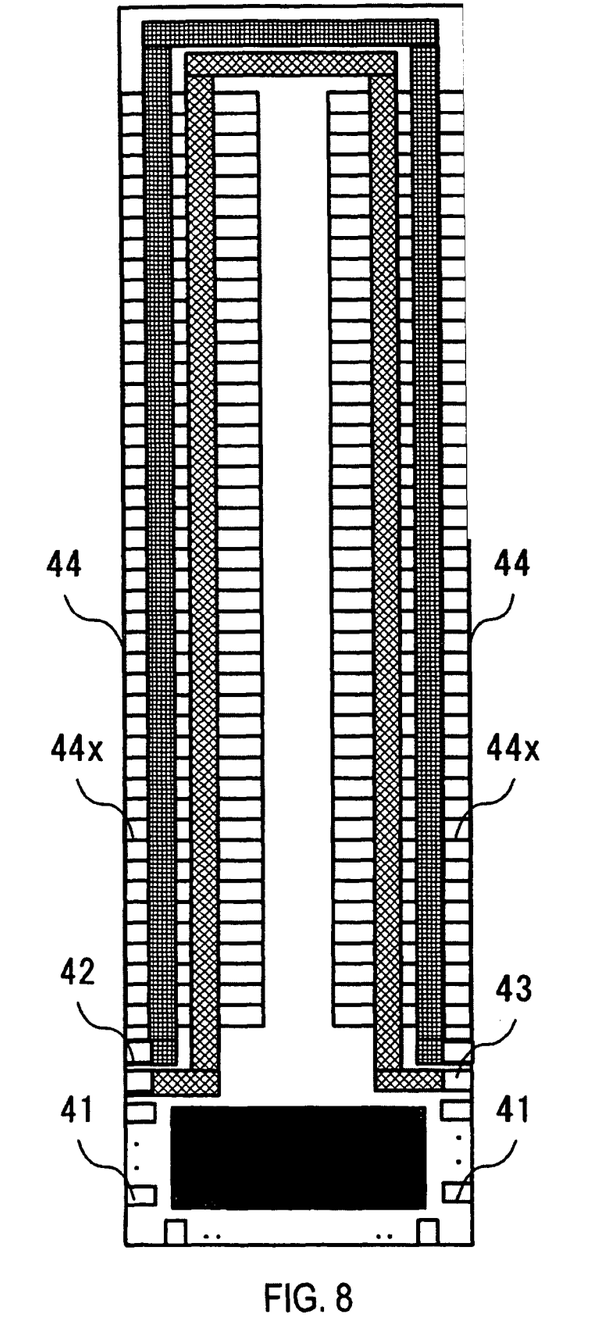
FIG. 8 is a diagram showing a two-row type of PDP address driver IC.

Another technology has also been proposed where the output terminals are disposed in two rows on one edge portion and on the other edge portion of the PDP address driver IC (abbreviated below as the "two-row type"). FIG. 8 is a diagram showing a two-row type of PDP address driver IC.

In the two-row type, all of input terminals 41 are disposed close together on one lateral-direction end of the PDP address driver IC, and output terminals 44x of output portions 44 are disposed in two rows on one edge portion and on the other edge portion. Also, in the two-row type, a power supply potential is supplied from two power supply terminals 42 at both ends of a power supply wiring, and a ground potential is supplied from two ground terminals 43 at both ends of a ground wiring.

In the two-row type, no gaps arise between the amplifier circuits in the vicinity of the input terminals 41 because the amplifier circuits connected to the input terminals 41 are arranged close together. Thus, the manufacturing costs of the PDP module and the PDP address driver IC are reduced because the chip size is reduced (see Gen Tada, Kazuhiro Kawamura and Masaru Saito, "PDP Address Driver IC Technology," in *Fuji Electric Journal*, Vol. 76, No. 3 (2003), pp. 172-174). As an application of this type, there is also a three-row type of PDP address driver IC where the input terminals 44x are disposed in three rows (see Yoshihiro Shigeta and Gen Tada, "A Color Plasma Display Driver IC," in *Fuji Electric Journal*, Vol. 69, No. 8 (1996), pp. 426-428).

However, in the one-row type, high-voltage circuits (under the power supply terminals 32 and the ground terminals 33) connected to output terminals 34x are disposed in the vicinity of the output terminals 34x, amplifier circuits connected to the input terminals 31 are disposed in the vicinity of the input terminals 31, and the high-voltage circuits operating at about 70 V are much larger than the amplifier circuits. For this reason, gaps arise between the amplifier circuits in the vicinity of the input terminals 31. Thus, the manufacturing costs of the PDP module and the PDP address driver IC are increased because the chip size is increased.

Also, in the two-row type and in a three-row type disclosed in the two aforementioned publications, when the PDP address driver IC is to be mounted with respect to a TCP, the terminals of the TCP are disposed in a direction perpendicular to the longitudinal direction of the PDP address driver IC. For this reason, the length in the winding direction of the TCP becomes longer, and the manufacturing cost of the PDP module increases. Moreover, in the two-row type and the three-row type, when the number of output terminals of the PDP address driver IC increases and the routing of the wiring connecting elemental devices to elemental devices becomes longer, it becomes easy for the wiring resistance of the ground wiring to rise because only the two ground terminals 43 are disposed with respect to the ground wiring. Thus, as it becomes easy for the wiring resistance to rise, it becomes easy for the ground potential to rise, and it becomes easy for the PDP address driver IC to malfunction.

SUMMARY OF THE INVENTION

The present invention has been made in view of this point, and it is an object thereof to provide a semiconductor device in which the chip size is small and the wiring resistance of the ground wiring is reduced.

Figure 1:
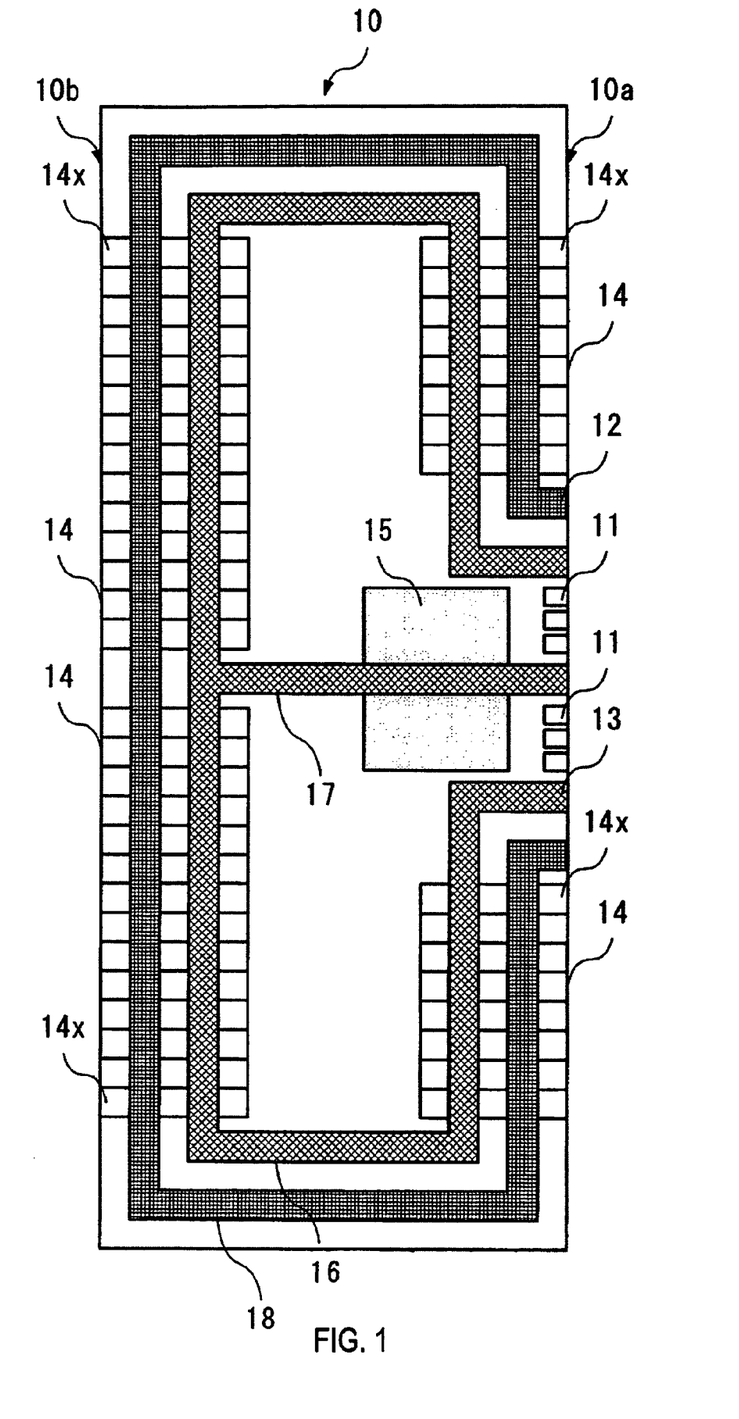
FIG. 1 is a schematic plan diagram showing a PDP address driver IC.

In order to solve this problem, as shown in FIG. 1, the present invention provides a semiconductor device disposed with terminals for external connection, wherein input terminals, power supply terminals and ground terminals are disposed close together on part of one edge portion of two opposing edge portions, output terminals are disposed in the vicinity of both ends of the one edge portion and on another edge portion of the two edge portions, and a ground wiring is routed from the other edge portion and connected to the ground terminals.

According to this semiconductor device, elemental devices connected to the input terminals are disposed close together, whereby needless gaps do not arise between the elemental devices. A ground potential is also supplied by the ground wiring.

In the present invention, the input terminals, the power supply terminals and the ground terminals are disposed close together on part of the one edge portion, and the ground wiring is routed from the other edge portion and connected to the ground terminals.

By configuring the device in this manner, elemental devices connected to the input terminals are disposed close together, whereby needless gaps do not arise between the elemental devices. Thus, the chip size can be reduced. Further, because the ground potential is also supplied by the ground wiring that are connected to three ground terminals, the wiring resistance of the ground wiring can be reduced.

DETAILED DESCRIPTION OF THE INVENTION

An embodiment of the present invention will be described in detail below with reference to the drawings. The present embodiment is one where the invention is applied to a PDP address driver IC that is mounted on a TCP inside a PDP module.

Figure 9:
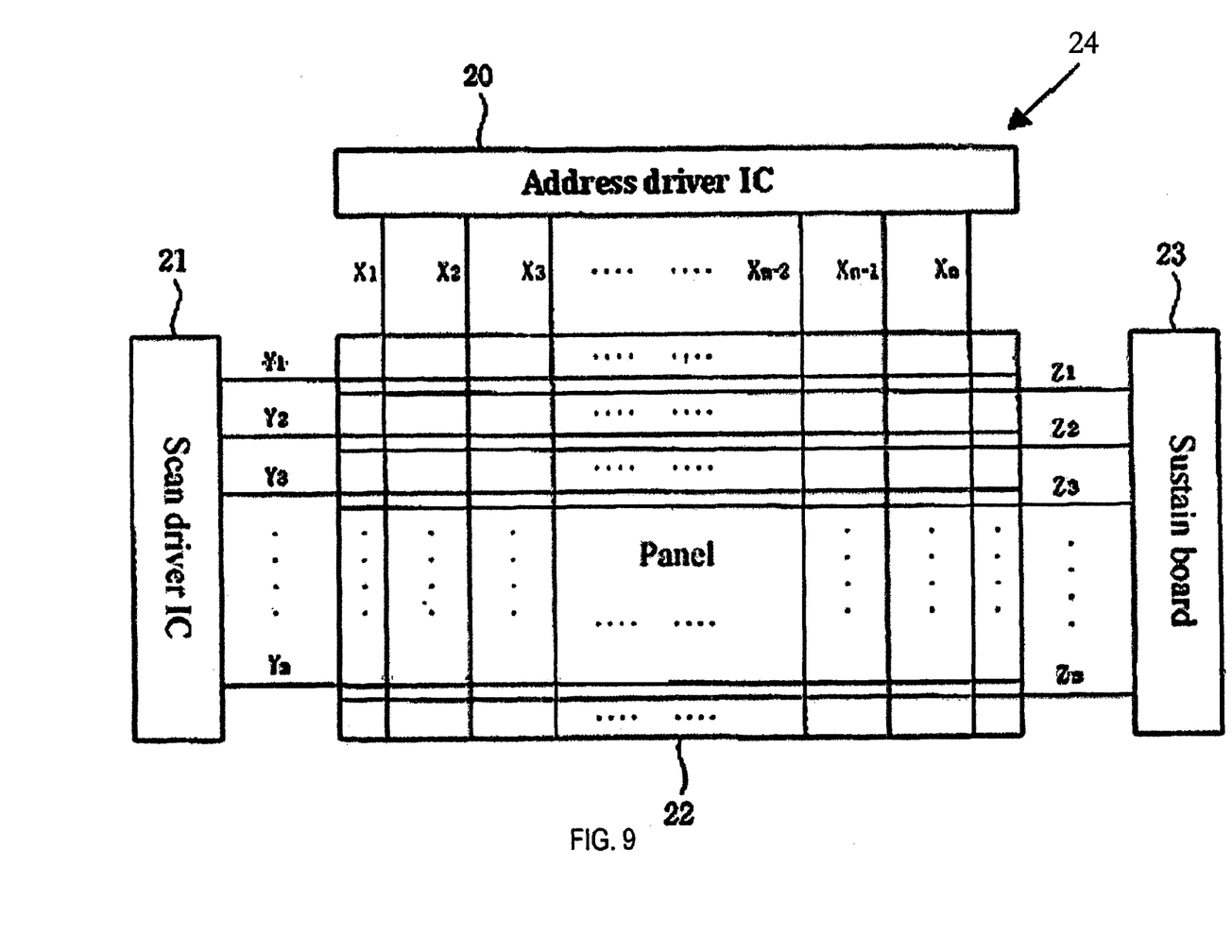
FIG. 9 is a diagram showing a PDP module.

An exemplary PDP module as shown in FIG. 9 comprises a drive module and a plasma display panel 22. The driving module can be composed of an address driver integrated circuit (IC) 20, a scan driver IC 21, and a sustain board 23. The plasma display panel 22 receives an image signal from the outside, an address pulse, which is output from the address driver IC 20 through a predetermined signal processing process, a scan pulse and a sustain pulse, which are output from the scan driver IC 21 and from the sustain board 23. Discharge is generated in a cell, which is selected among the plurality of the cells included in the plasma display panel 22 that has received the address pulse, the scan pulse, the sustain pulse, and the like according to the scan pulse. The cell where discharge has occurred emits light with a predetermined brightness. At this time, the address driver IC 20 outputs a predetermined address pulse to each of the address electrodes X1 to Xn through a connector such as a FPC (Flexible Printed Circuit) (not shown).

Figure 2:
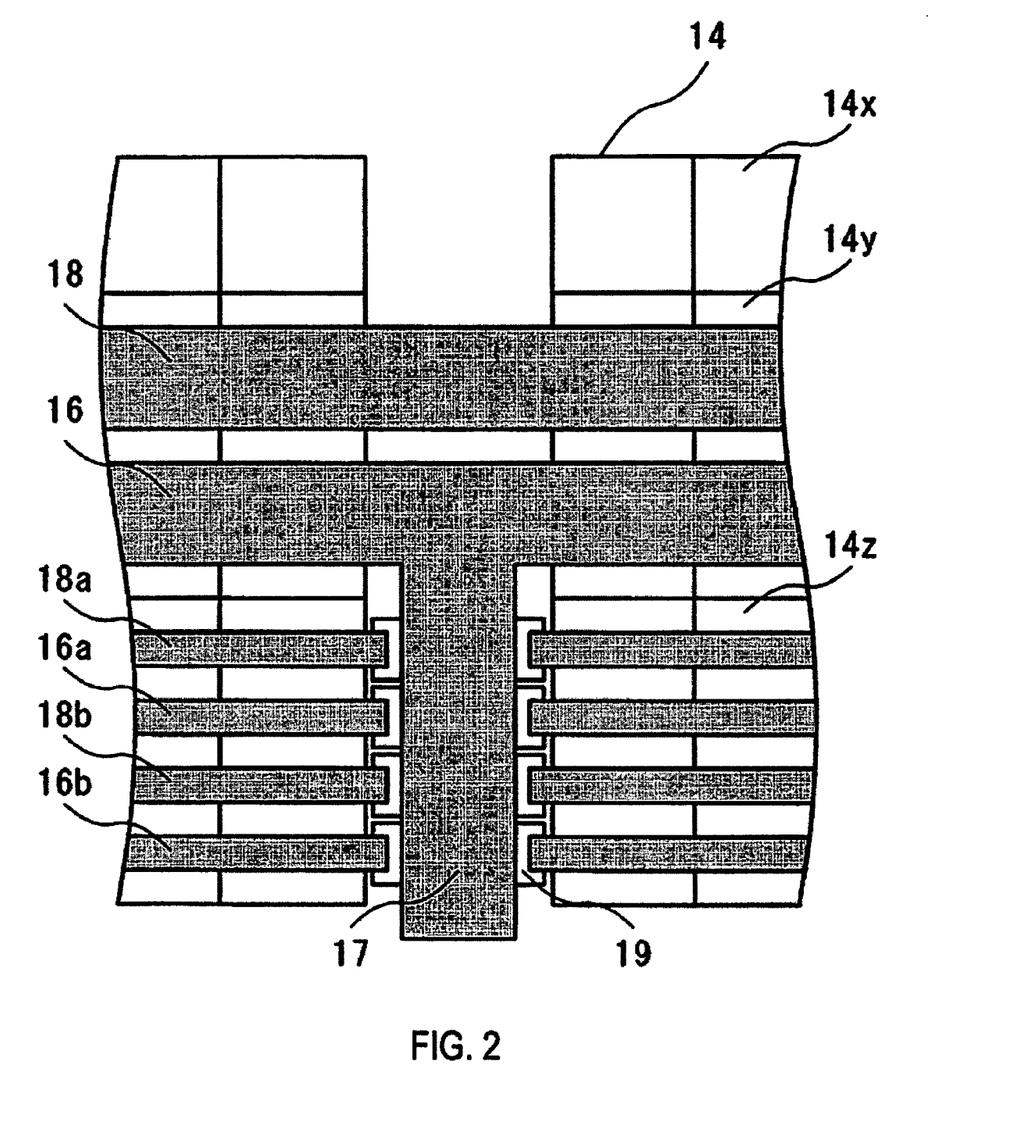
FIG. 2 is a diagram showing the disposition of an output portion.

First, a PDP address driver IC 10 will be described. FIG. 1 is a schematic plan diagram showing the PDP address driver IC 10, and FIG. 2 is a diagram showing the disposition of an output portion 14. The PDP address driver IC 10 includes one edge portion 10a and another edge portion 10b that oppose each other in the longitudinal direction. Input terminals 11, power supply terminals 12 and ground terminals 13 are disposed in the vicinity of the center of the one edge portion 10a of the PDP address driver IC 10. The power supply terminals 12 are connected to a peripheral power supply wiring 18, and the ground terminals 13 are connected to a peripheral ground wiring 16 and to a central ground wiring 17 routed from the vicinity of the center of the other edge portion 10b. The output portions 14 are disposed in the vicinities of both ends of the one edge portion 10a and on the other edge portion 10b of the PDP address driver IC 10. As shown in FIG. 2, the output portions 14 are configured by output terminals 14x, high-voltage circuits 14y and logic circuits 14z, and are sequentially disposed inward from the edge portions of the PDP address driver IC 10.

The peripheral power supply wiring 18 and the peripheral ground wiring 16 are routed above the high-voltage circuits 14y, and logic power supply wirings 18a and 18b (not shown in FIG. 1), logic ground wirings 16a and 16b (not shown in FIG. 1), and signal wirings (not shown) are routed above the upper logic circuits 14z. The logic circuits 14z are connected to the input terminals 11 and the output terminals 14x via amplifier circuits 15 and the high-voltage circuits 14y. The peripheral power supply wiring 18, the peripheral ground wiring 16, the logic power supply wirings 18a and 18b, and the logic ground wirings 16a and 16b comprise metal layers formed at the same time that are molded by patterning, and occupy the same layer. The output portions 14 are not formed at the place where the central ground wiring 17 is routed; rather, underlying wirings 19 (not shown in FIG. 1) are formed, and the logic power supply wirings 18a and 18b and the logic ground wirings 16a and 16b are connected to the underlying wirings 19.

In the PDP address driver IC 10, the luminescences of the pixels of the plasma display are designated. Specifically, a power supply potential and a ground potential are supplied to the high-voltage circuits from the power supply terminals 12 via the peripheral power supply wiring 18, the ground terminals 13 via the peripheral ground wiring 16, and the ground terminals 13 via the central ground wiring 17. Further, the power supply potential and the ground potential are supplied from the input terminals 11 to circuits that are not for high-voltage. Using the power supply potential and the ground potential, input signals received via the input terminals 11 are amplified by the amplifier circuits 15. Predetermined processing is executed with respect to the amplified input signals, and output signals serving as address signals are inputted to the logic circuits 14z via the signal wirings (not shown) and sent, via the output terminals 14x, by the high-voltage circuits 14y controlled by the logic circuits 14z.

Figure 3:
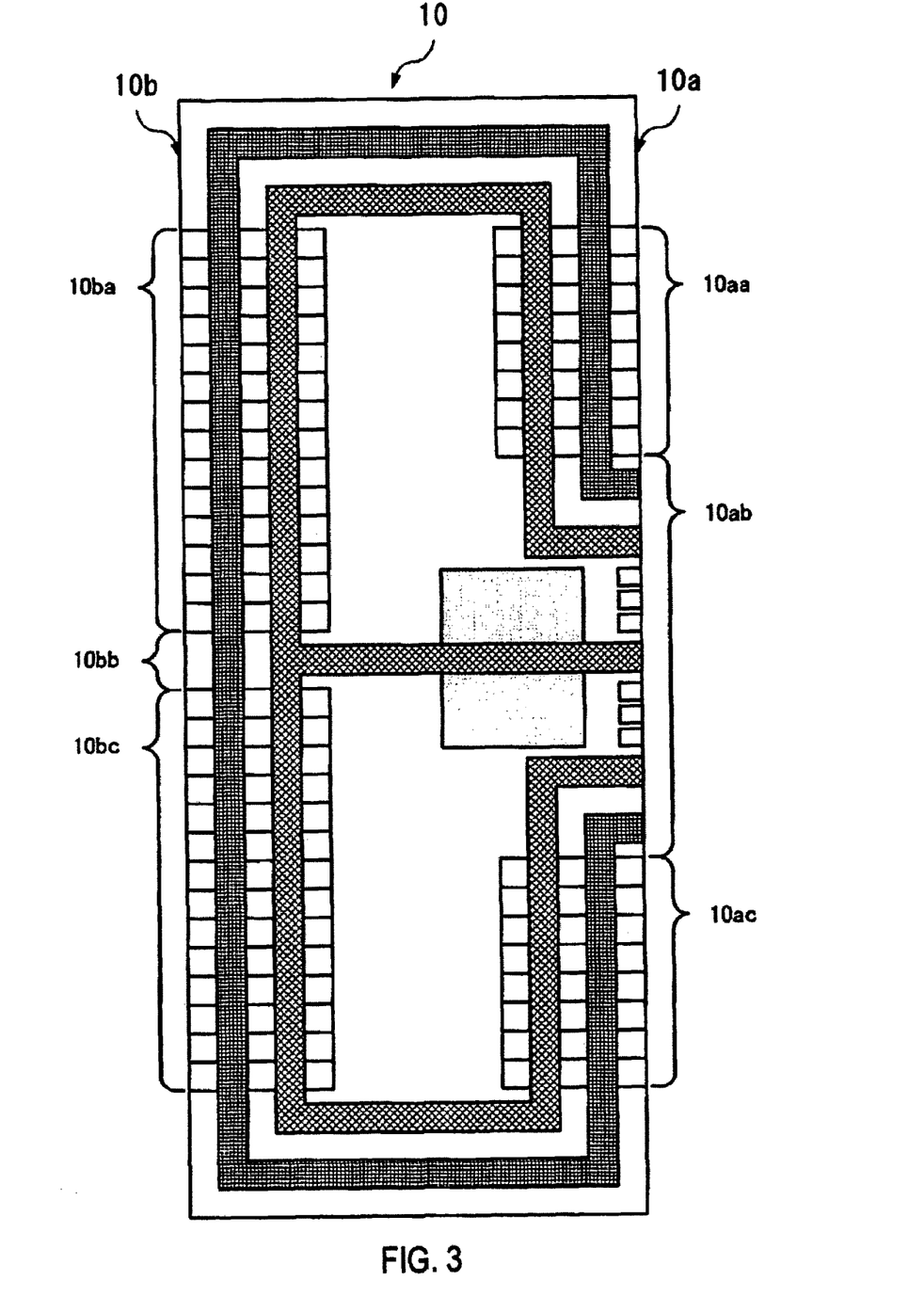
FIG. 3 is a diagram showing an estimate example of chip size.

Next, an estimate example of the chip size of the PDP address driver IC 10 will be described. FIG. 3 is a diagram showing an estimate example of chip size. Here, the range where the high-voltage circuits and the logic circuits are not disposed under the central ground wiring 17 is 140 μm. Also, a total of 34 of the input terminals 11, the power supply terminals 12 and the ground terminals 13 are required, and a total of 256 of the output terminals 14x are required. Also, the disposed distance between each of the terminals is 70 μm.

The disposition of the terminals is most efficiently done in accordance with the number of terminals, the disposed distance between each of the terminals, and the flow of the signals inside the PDP address driver IC 10. Particularly when the terminals are disposed such that the lengths of the one edge portion 10a and the other edge portion 10b become closer, the chip size of the PDP address driver IC 10 can be reduced.

At the one edge portion 10a of the PDP address driver IC 10, a first area 10aa is 3920 (56×70) μm because there are a total of 56 output terminals. A second area 10ab is 2380 (34×70) μm because there are a total of 34 input terminals 11, power supply terminals 12 and ground terminals 13. A third area 10ac is 3920 (56×70) μm because there are a total of 56 output terminals. The total length of the first area 10aa, the second area 10ab and the third area 10ac is 10220 μm.

At the other edge portion 10b of the PDP address driver IC 10, a fourth area 10ba is 5040 (72×70) μm because there are a total of 72 output terminals. A fifth area 10bb is 140 μm. A sixth area 10bc is 5040 (56×70) μm because there are a total of 72 output terminals. The total length of the fourth area 10ba, the fifth area 10bb and the sixth area 10bc is 10220 μm.

In this manner, because the lengths of the one edge portion 10a and the other edge portion 10b are equal, the chip size can be reduced. Even when the lengths of the one edge portion 10a and the other edge portion 10b are not equal, the chip size of the PDP address driver IC 10 can be reduced when the terminals are disposed in accordance with the specifications of the PDP address driver IC 10 such that the lengths of the one edge portion 10a and the other edge portion 10b are as close as possible.

Figure 4:
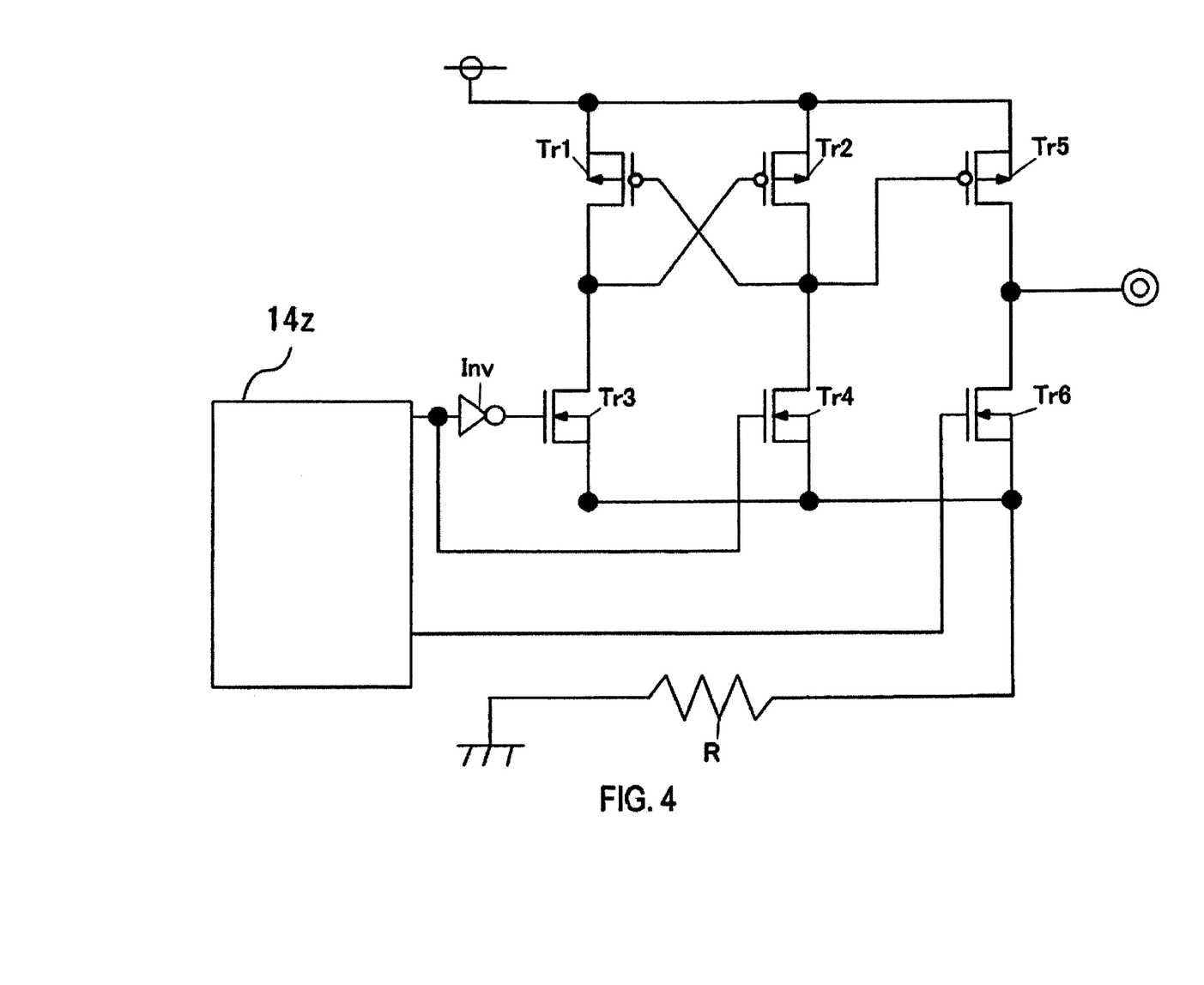
FIG. 4 is a circuit diagram of the output portion of one bit.

Next, the high-voltage circuits 14y of the PDP address driver IC 10 will be described. FIG. 4 is a circuit diagram of the output portion of one bit. Each of the high-voltage circuits 14y includes transistors Tr1, Tr2, Tr3, Tr4, Tr5 and Tr6, an inverter Inv, and a wiring resistance R. Here, the transistors Tr1 and Tr2 retain, while mutually inverting, signals respectively inputted thereto. The mutually inverted signals are inputted to the transistors Tr3 and Tr4 from the logic circuit 14z via the inverter Inv. The transistors Tr5 and Tr6 are the output stage of the high-voltage circuit 14y. The wiring resistance R is the resistance of the peripheral ground wiring 16.

In the high-voltage circuits 14y, the output signal is maintained at a constant potential in order to prevent malfunction of the PDP address driver IC 10 during the sustain period of the output signal outputted from the high-voltage circuits 14y. For example, when the transistor Tr6 is switched ON and a high-voltage ground potential is outputted to the output terminals 14x, the output signal is maintained at substantially 0 V. In the conventional two-row type of PDP address driver IC shown in FIG. 8, the potential of the output signal rises due to the wiring resistance and malfunctions (erroneous light emission) occur when a surge current flows into the high-voltage circuits 14y during the sustain period of the output signal. But in the present embodiment, the output signal is maintained at substantially 0 V because the ground potential is also supplied by the central ground wiring 17. Although the potential of the output signal rises in response to the surge current and the wiring resistance R, the ground potential is also supplied by the central ground wiring 17 and the wiring resistance R is small, so that the potential of the output signal does not rise. Thus, it becomes difficult for the PDP address driver IC 10 to malfunction.

Also, because the peripheral power supply wiring 18, the peripheral ground wiring 16, the logic power supply wirings 18a and 18b, and the logic ground wirings 16a and 16b comprise metal layers formed at the same time that are molded by patterning, the manufacturing process is simple and the manufacturing cost can be reduced in comparison to when malfunctions are suppressed by multi-layering these wirings, widely forming the peripheral power supply wiring 16 and lowering the wiring resistance.

Figure 5:
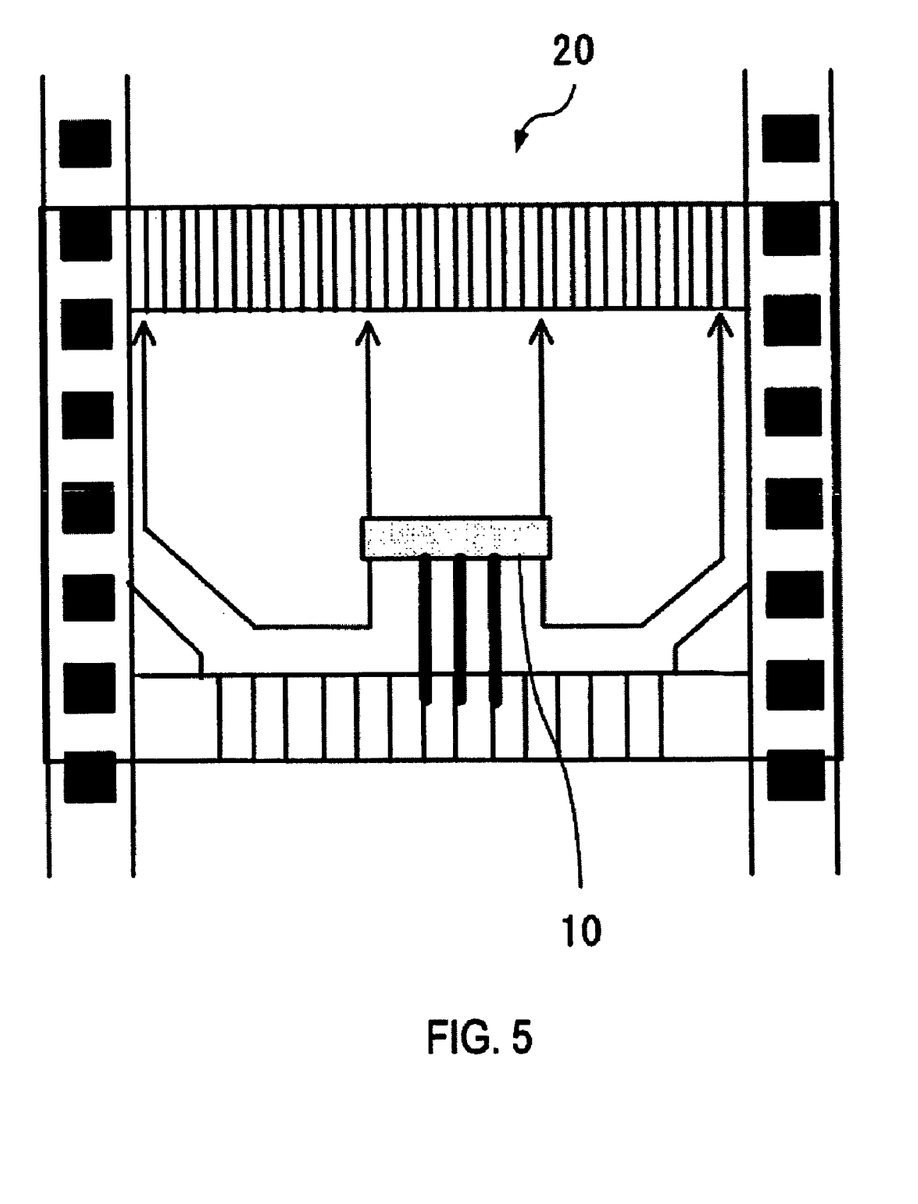
FIG. 5 is a diagram showing mounting with respect to a TCP.

Next, a case will be described where the PDP address driver IC 10 is mounted with respect to a TCP 20. FIG. 5 is a diagram showing the mounting with respect to the TCP 20. In order to prevent the PDP address driver IC 10 from breaking, the longitudinal direction of the PDP address driver IC 10 and the winding direction of the TCP 20 are perpendicular. Terminals of the TCP 20 are disposed parallel to the longitudinal direction of the PDP address driver IC 10. Specifically, terminals corresponding to the input terminals 11, the power supply terminals 12 and the ground terminals 13 are disposed on one edge portion of the TCP 20, and terminals corresponding to the output terminals 14x are disposed on another edge portion of the TCP 20.

By configuring the device in this manner, needless gaps do not arise between the amplifier circuits 15 because the amplifier circuits 15 connected to the input terminals 11 are disposed close together. Thus, the chip size can be made smaller, and the manufacturing costs of the PDP address driver IC 10 and the PDP module can be lowered.

Further, the ground potential is also supplied from the central ground wiring 17, and the ground potential is supplied from the three ground terminals 13. For this reason, the wiring resistance R of the peripheral ground wiring 16 and the central ground wiring 17 can be reduced when the PDP address driver IC 10 is mounted with respect to the TCP 20. Thus, it becomes difficult for the PDP address driver IC 10 and the PDP module to malfunction.

Further, the ground potential is also supplied from the central ground wiring 17, and the three ground terminals 13 are disposed on the one edge portion 10a. For this reason, the ground potential can be supplied with respect to the vicinity of the center of the peripheral ground wiring 16 by a single-layer wiring when the PDP address driver IC 10 is mounted with respect to the TCP 20. Thus, the manufacturing cost of the PDP module can be lowered because the manufacturing process of the PDP module can be simplified.

Also, because the terminals of the TCP 20 are disposed parallel to the longitudinal direction of the PDP address driver IC 10, the length in the winding direction of the TCP 20 can be shortened. Thus, the manufacturing cost of the PDP module can be lowered.

Figure 6:
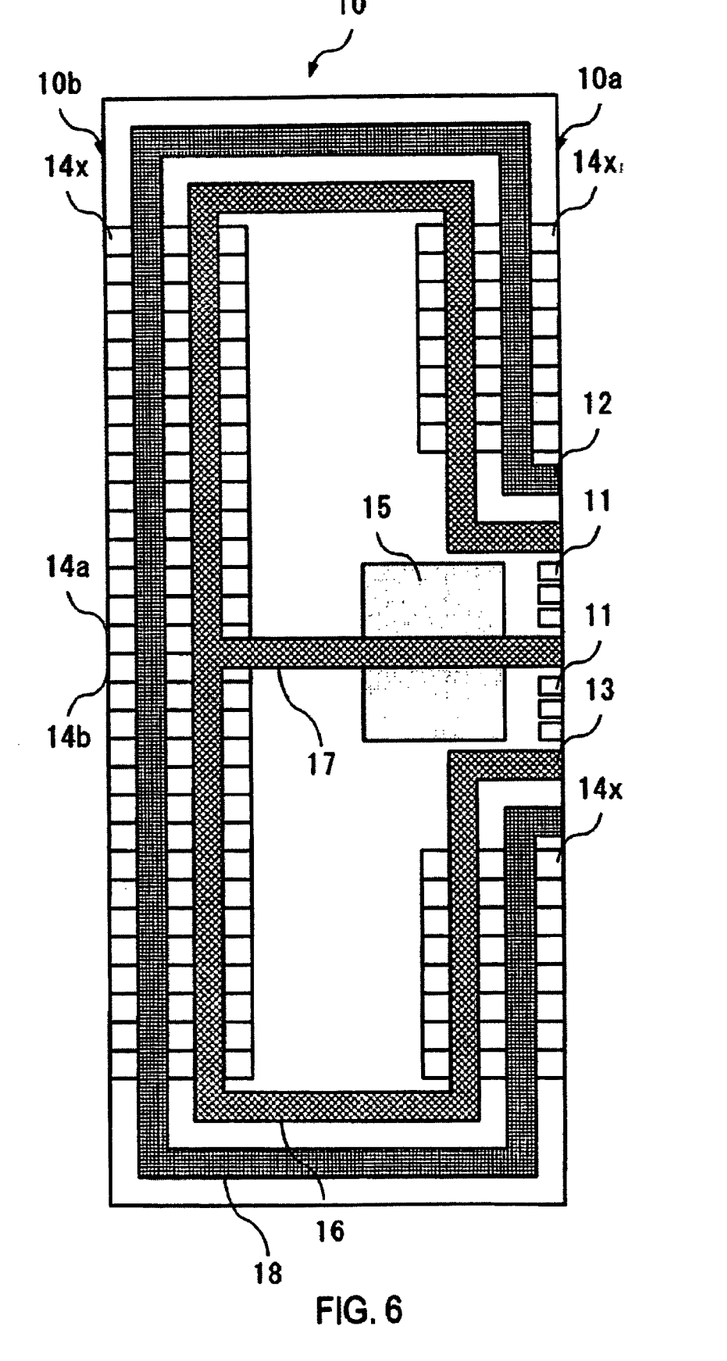
FIG. 6 is a diagram showing another PDP address driver IC.

It will be noted that the invention may also be configured such that the output portions 14 are disposed under the central ground wiring 17. FIG. 6 is a diagram showing another PDP address driver IC. Here, output portions 14a and 14b may be able to be disposed under the central ground wiring 17 by adjusting the routing direction of the peripheral ground wiring 16 and the central ground wiring 17.

For example, when the output portions 14a and 14b are disposed under the central ground wiring 17, above the output portions the logic ground wirings (16a and 16b) and the logic power supply wirings (18a and 18b) are formed in the same layer as the peripheral ground wiring 16. Also, underlying wirings connected with the central ground wiring 17 are formed in the high-voltage circuits 14y and the logic circuits 14z disposed under the central ground wiring 17. The underlying wirings are formed such that they avoid the various wirings that the high-voltage circuits 14y and the logic circuits 14z have. The logic ground wirings (16a and 16b) and the logic power supply wirings (18a and 18b) are formed such that they stride the underlying wirings.

It will be appreciated by those skilled in the art that numerous variations are possible and that the invention may be practiced otherwise than as described herein without departing from the scope of the invention.

What is claimed is:

1. A plasma display module comprising:
    an address driver integrated circuit (IC) having opposing first and second edge portions, the IC including;
    input terminals;
    power supply terminals;
    ground terminals;
    a peripheral ground wiring;
    a central ground wiring; and
    output terminals;

wherein the power supply terminals, the ground terminals and the input terminals are disposed only on the first edge portion, and the output terminals are disposed on the first and second edge portions, first and second ends of the peripheral ground wiring are routed to the first edge portion, a first end of the central ground wiring is routed to the first edge portion, and a second end of the central ground wiring is routed to a center of the peripheral ground wiring.

2. The plasma display module of claim 1, wherein the first edge portion has two opposite ends and the output terminals are disposed in a vicinity of each of the opposite ends.

3. The plasma display module of claim 1, wherein the input terminals are disposed between the output terminals.

4. The plasma display module of claim 2, further comprising a high-voltage circuit, wherein the ground wiring is disposed over the high-voltage circuit and supplied a voltage from at least one of the ground terminals and the power supply terminals.

5. The plasma display module of claim 1, further comprising a power supply wiring routed to the first edge portion.

6. The plasma display module of claim 5, further comprising a high-voltage circuit, wherein the power supply wiring is disposed over the high-voltage circuit and supplied a voltage from at least one of the ground terminals and the power supply terminals.

7. The plasma display module of claim 1, further comprising a Tape Carrier Package (TCP), wherein the IC is mounted on the TCP.

8. The plasma display module of claim 1, wherein the central ground wiring is disposed between the input terminals.

9. The plasma display module of claim 1, wherein at least two of a peripheral power supply wiring, the peripheral ground wiring, a logic power supply wiring and a logic ground wiring are formed in a same layer.

10. The plasma display module of claim 9, further comprising an underlying wiring, wherein the logic power supply wiring and the logic ground wiring are connected to the underlying wiring.

11. The plasma display module of claim 1, further comprising a Tape Carrier Package (TCP) and TCP terminals on the TCP, wherein the TCP terminals include first and second TCP terminals, the first TCP terminals corresponding to the input terminals, the power supply terminals and the ground terminals being disposed on a first edge portion of the TCP, the second TCP terminals corresponding to the output terminals and being disposed on a second edge portion of the TCP.

12. The plasma display module of claim 1, further comprising:

a plasma display panel including a plurality of address electrodes, the IC applying a voltage to the plurality of address electrodes.

* * * * *